United States Patent
Qiu et al.

(10) Patent No.: US 12,038,457 B2
(45) Date of Patent: Jul. 16, 2024

(54) APPARATUS AND SYSTEM FOR GENERATING MAGNETIC FIELDS IN INACCESSIBLE REGIONS

(71) Applicant: Keysight Technologies, Inc., Santa Rosa, CA (US)

(72) Inventors: Tie Qiu, Singapore (SG); Andrew Tek, Singapore (SG); Shaoying Huang, Singapore (SG); Manish Prajapati, Singapore (SG)

(73) Assignee: KEYSIGHT TECHNOLOGIES, INC., Santa Rosa, CA (US)

( * ) Notice: Subject to any disclaimer, the term of this patent is extended or adjusted under 35 U.S.C. 154(b) by 123 days.

(21) Appl. No.: 17/506,745

(22) Filed: Oct. 21, 2021

(65) Prior Publication Data

US 2023/0133953 A1    May 4, 2023

(51) Int. Cl.
*G01R 1/07* (2006.01)
*G01R 31/08* (2020.01)
*G01R 31/66* (2020.01)

(52) U.S. Cl.
CPC ............. *G01R 1/07* (2013.01); *G01R 31/086* (2013.01); *G01R 31/66* (2020.01)

(58) Field of Classification Search
CPC ........ G01R 1/07; G01R 31/086; G01R 31/66; G01R 31/2812; G01R 31/315
See application file for complete search history.

(56) References Cited

U.S. PATENT DOCUMENTS

| | | | |
|---|---|---|---|
| 5,424,633 A | 6/1995 | Soiferman | |
| 6,937,035 B2 * | 8/2005 | Kawaike | G01R 31/315 324/763.01 |
| 2020/0076232 A1 | 3/2020 | Woo et al. | |

OTHER PUBLICATIONS

Rosa Mach-Batlle et al. "Manipulating magnetic fields in inaccessible regions by negative magnetic permeability", Universitat Autonoma de Barcelona, Spain, Dec. 18, 2019, pp. 1-23.

(Continued)

*Primary Examiner* — Farhana A Hoque (57) ABSTRACT

A sensor device for testing electrical connections using contactless fault detection is disclosed. The sensor device includes: a surface coil comprising a plurality of concentric loops disposed at a first region located away from the electrical connections. The concentric loops generate a first magnetic field passing through the electrical connections, and the first magnetic field is equivalent to that generated by a coaxial intermediate current loop adjacent to the electrical connections based on an excitation current in the surface coil. The sensor device further includes a sensor adapted to detect a second magnetic field at a second region located away from the electrical connections, wherein variations in the detected second magnetic field provide categories of performance of the electrical connections.

20 Claims, 6 Drawing Sheets

(56) References Cited

OTHER PUBLICATIONS

Nabil El-Belghiti et al., "New testing approach using near electro magneticfield probing intending to upgrade in circuit testing of high density PCBAs", 27th IEEE North Atlantic Test Workshop, May 2018, 1-9 pgs.
Chinese Office Action dated May 31, 2023, Application No. 202222758798.9, 2 pgs.
English translation of Chinese Office Action dated May 31, 2023, 3 pgs.
Xianming Qing et al., "MRI Coils Using Metamaterials," 2015 IEEE International Symposium on Antennas and Propagation & USNC/URSI National Radio Science Meeting, Vancouver, BC, Canada, 2015, pp. 1348-1349.

\* cited by examiner

APPARATUS AND SYSTEM FOR GENERATING MAGNETIC FIELDS IN INACCESSIBLE REGIONS

BACKGROUND

Electrical and electronic components require testing to ensure proper working order. For example, integrated circuits and printed circuit board assemblies (PCBAs) have many electrical components that can be faulty. These faults, such as open circuits or breaks, and short circuits can wreak havoc on the functionality of the devices in which these occur. Accordingly, there is a need to test devices to determine where a fault is located.

However, because these faults are often located in regions of the device under test (DUT) that are not readily accessible, if at all, present attempts to determine faults in the electrical connections of the DUT are rather limited. For example, certain existing solutions in in-circuit testing (ICT) of PCBAs either use powered DUT (e.g., powered PCBAs), or contact probes when the DUT is not powered during testing. Many of the known devices used in such testing applications require physical contact to the DUT by a probe sensor tip. Notably, powered ICT techniques have limited testing capabilities and could inadvertently inflict further damage to a faulty PCB during testing. In this aspect, contact probes have provided reliable ICT solutions for unpowered DUTs. However, due to ever increasing component density and limited space for testing points or pogo pins on PCBs, contact known probes have limited capabilities. Furthermore, because of the inaccessibility of many locations of devices, such as multilayer PCBs and advanced IC packages (e.g., IC packages comprising Ball Grid Arrays (BGAs)), contact probes to effect desired testing are not practical or useful. Also, it is common for many multilayer electronic boards and packages to have several components within multiple dielectric layers. To this end, known contact probes cannot physically reach these components for testing and therefore cannot be used in such devices.

What is needed, therefore, is a solution that overcomes at least the drawbacks of known methods and systems described above.

SUMMARY

According to an aspect of the present disclosure, a sensor device for testing electrical connections using contactless fault detection is disclosed. The sensor device comprises: a surface coil comprising a plurality of concentric loops disposed at a first region located away from the electrical connections. The concentric loops generate a first magnetic field passing through the electrical connections, and the first magnetic field is equivalent to that generated by a coaxial intermediate current loop adjacent to the electrical connections based on an excitation current in the surface coil. The sensor device further comprises a sensor adapted to detect a second magnetic field at a second region located away from the electrical connections, wherein variations in the detected second magnetic field provide categories of performance of the electrical connections.

According to another aspect of the present disclosure, a system for testing electrical connections in device under test (DUT) using contactless fault detection is disclosed. The system comprises: a surface coil comprising a plurality of concentric loops disposed at a first region located away from the electrical connections. The concentric loops generate a first magnetic field passing through the electrical connections, and the first magnetic field is equivalent to that generated by a coaxial intermediate current loop adjacent to the electrical connections based on an excitation current in the surface coil. The system also comprises a sensor adapted to detect a second magnetic field at a second region located away from the electrical connections. Variations in the detected second magnetic field provide categories of performance of the electrical connections. The system also comprises a controller adapted to adjust a location and a current value of the surface coil to provide the coaxial intermediate current loop at a desired location.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

In the following detailed description, for the purposes of explanation and not limitation, representative embodiments disclosing specific details are set forth in order to provide a thorough understanding of an embodiment according to the present teachings. Descriptions of known systems, devices, materials, methods of operation and methods of manufacture may be omitted so as to avoid obscuring the description of the representative embodiments. Nonetheless, systems, devices, materials and methods that are within the purview of one of ordinary skill in the art are within the scope of the present teachings and may be used in accordance with the representative embodiments. It is to be understood that the terminology used herein is for purposes of describing particular embodiments only and is not intended to be limiting. The defined terms are in addition to the technical and scientific meanings of the defined terms as commonly understood and accepted in the technical field of the present teachings.

It will be understood that, although the terms first, second, third, etc. may be used herein to describe various elements or components, these elements or components should not be limited by these terms. These terms are only used to distinguish one element or component from another element or component. Thus, a first element or component discussed below could be termed a second element or component without departing from the teachings of the inventive concept.

The terminology used herein is for purposes of describing particular embodiments only and is not intended to be limiting. As used in the specification and appended claims, the singular forms of terms "a," "an" and "the" are intended to include both singular and plural forms, unless the context clearly dictates otherwise. Additionally, the terms "comprises," "comprising," and/or similar terms specify the presence of stated features, elements, and/or components, but do not preclude the presence or addition of one or more other features, elements, components, and/or groups thereof. As used herein, the term "and/or" includes any and all combinations of one or more of the associated listed items.

Unless otherwise noted, when an element or component is said to be "connected to," "coupled to," or "adjacent to" another element or component, it will be understood that the element or component can be directly connected or coupled to the other element or component, or intervening elements or components may be present. That is, these and similar terms encompass cases where one or more intermediate elements or components may be employed to connect two elements or components. However, when an element or component is said to be "directly connected" to another element or component, this encompasses only cases where the two elements or components are connected to each other without any intermediate or intervening elements or components.

The present disclosure, through one or more of its various aspects, embodiments and/or specific features or sub-components, is thus intended to bring out one or more of the advantages as specifically noted below. For purposes of explanation and not limitation, example embodiments disclosing specific details are set forth in order to provide a thorough understanding of an embodiment according to the present teachings. However, other embodiments consistent with the present disclosure that depart from specific details disclosed herein remain within the scope of the appended claims. Moreover, descriptions of well-known apparatuses and methods may be omitted so as to not obscure the description of the example embodiments. Such methods and apparatuses are within the scope of the present disclosure.

By the present teachings, magnetic fields may be induced in regions of interest that are not accessible. Notably, while the representative embodiments are directed primarily to non-contact testing of electrical connections in a variety of electronic devices and systems, and this will be appreciated by one of ordinary skill in the art, various aspects of the present teachings may be applied in many other technical fields where manipulation of dynamic or static magnetic fields is useful. Notably, the various aspects of the present teachings provide not only a practical application in the testing of electrical connections by generating a magnetic field in an inaccessible region of interest, practical applications of the present teachings are contemplated in other electrical technical disciplines, including, but not limited to, power generators/supplies, transformers, wireless power transfer devices. As described more fully below, the devices and systems of the present teachings incorporate magnetic materials, and in particular, those requiring a negative permeability to create and control a magnetic source at a distance from the excitation coil in locations that are inaccessible, such as in non-destructive testing of electrical connections in ICs and multilayer circuit boards that are ubiquitous in many modern electronic devices.

Various improvements to the field of measurement and testing are realized by the implementation of practical applications of the present teachings and according to representative embodiments described below. By way of example, and not limitation, magnetic field sensor devices of the present teachings enable control of magnetic fields at remote and inaccessible regions for IC testing applications in large scale at the fab. As described more fully below, during testing, the DUT does not have to be powered up to complete the testing. Thus, in a practical application of the present teachings, testing of a DUT (e.g., a PCBA) is safer when identifying defects such as open circuit defects and short circuits when the defect is in place and uncorrected, thereby avoiding irreversible damage to the DUT. Furthermore, the system and attendant magnetic field coil is truly contactless, and thereby can effect non-destructive testing of DUTs. Moreover, the components of the system of various representative embodiments are made of comparatively inexpensive parts, including for example, the simple concentric coil structures used to create the magnetic field in inaccessible regions, such as in a multilayer circuit board.

Figure 1:
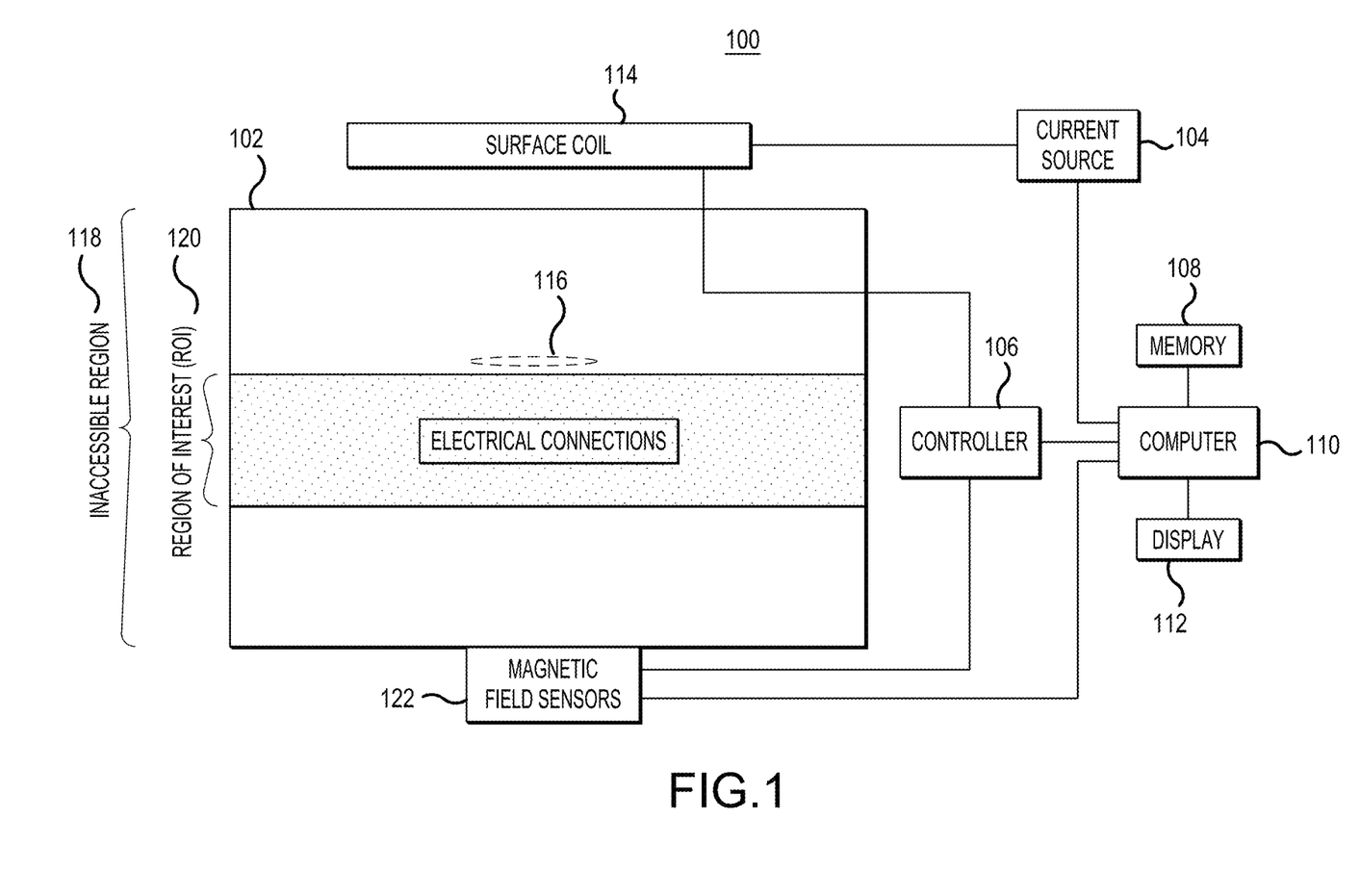
FIG. 1 is a simplified block diagram of a system for testing a DUT, according to a representative embodiment.

FIG. 1 is a simplified block diagram of a system 100 for testing a DUT 102, according to a representative embodiment. As alluded to above, and as discussed more fully below, the DUT 102 may be an electronic device such as an IC or PCBA. But again, this is merely illustrative and other applications of the system 100 are contemplated by the present teachings.

Referring to FIG. 1, the system 100 comprises a current source 104, a controller 106, a memory 108, a computer 110 and a display 112. The system 100 also comprises a surface coil 114, which as described more fully below, illustratively comprises concentric surface coil loops. In accordance with representative embodiments, the surface coil 114 is adapted to generate intermediate coaxial current loops 116 in an inaccessible region 118. These intermediate coaxial current loops 116 generate a magnetic field (sometimes referred to herein as a first magnetic field) in a region of interest 120, which illustratively comprises electrical connections, such as would be found in an IC or multilayer circuit board (not shown in FIG. 1). As describe more fully below, the first magnetic field generated in the region of interest 120 in turn induces current in the electrical connections in the region of interest, and these in turn creates a magnetic field (sometimes referred to herein as a third magnetic field).

A magnetic field sensor 122 is located in an accessible region of the system 100 (e.g., on the outside of the DUT) and measures a magnetic field (sometimes referred to herein as a second magnetic field) located in this accessible region. The magnetic field sensor 122 may be one of a variety of known magnetic field sensors including Hall Effect sensor, Giant magnetoresistance (GMR) sensor, pickup coil sensor, to name a few illustrative examples.

Notably, the second magnetic field is a sum of the first magnetic field and the third magnetic field. In accordance with various representative embodiments, the second magnetic field may be used to determine short-circuit defects and open-circuit defects in the electrical connections in the region of interest 120. Specifically, the short circuit defect blocks the first magnetic field from the intermediate coaxial current loop 116, and results in the second magnetic field having a lower magnetic field measured by the magnetic field sensor 122 compared with an electrical connection without a short circuit defect. By contrast, the open circuit defect causes magnetic field leakage through the open circuit defect to the magnetic field sensor 122 and results in the second magnetic field having a greater magnitude measured by the sensor compared with an electrical connection without an open circuit.

The computer 110 interfaces with the current source 104 and the controller 106. The memory 108 stores instructions executable by the computer 110 and the controller 106. When executed, the instructions cause the computer 110 to send a control signal to the current source 104 and a control signal to the controller 106 to implement testing of the DUT 102. Specifically, and as will become clearer as the present description continues, the control signals provided to the current source 104 cause the current source 104 to send current of a desired value to the surface coil 114 so that testing of the DUT can be carried out. The control signals sent by the computer 110 to the controller 106 cause the controller to move the surface coil 114 and magnetic field sensor 122 to the position for testing with sufficient sensitivity to distinguish the magnetic field variation caused by the defects. Moreover, both the surface coil 114 and magnetic field sensor 122 can be formed into an array to accelerate the testing speed. Just by way of example, movement of the surface coil 114 and magnetic field sensor 122 may be done using a stepper motor (not shown) or a microelectromechanical system (MEMS) device within the purview of the ordinarily skilled artisan. Finally, signals from the magnetic field sensor 122 are provided to the computer 110 and are presented on the display for review by a user (not shown). As noted above, the signals from the magnetic field sensor 122 can be used to determine faults in the electrical connections in the region of interest 120.

The computer 110 illustratively comprises one or more processing devices, and is configured to execute software instructions to perform functions as described in the various embodiments herein. The computer 110 may comprise by field programmable gate arrays (FPGAs), application specific integrated circuits (ASICs), a general purpose computer, a central processing unit, a computer processor, a microprocessor, a microcontroller, a state machine, programmable logic device, or combinations thereof, using any combination of hardware, software, firmware, hard-wired logic circuits, or combinations thereof. Additionally, any processing unit or processor herein may include multiple processors, parallel processors, or both. Multiple processors may be included in, or coupled to, a single device or multiple devices.

The term "processor" as used herein encompasses an electronic component able to execute a program or machine executable instruction. References to a computing device comprising "a processor" should be interpreted to include more than one processor or processing core, as in a multi-core processor. A processor may also refer to a collection of processors within a single computer system or distributed among multiple computer systems, such as in a cloud-based or other multi-site application. The term computing device should also be interpreted to include a collection or network of computing devices each including a processor or processors. Programs have software instructions performed by one or multiple processors that may be within the same computing device or which may be distributed across multiple computing devices.

The memory 108 may include a main memory and/or a static memory, where such memories may communicate with each other and the controller 106 via one or more buses. The memory 108 stores instructions used to implement some or all aspects of testing methods as described herein. The memory 108 may be implemented by any number, type and combination of random access memory (RAM) and read-only memory (ROM), for example, and may store various types of information, such as software algorithms, which serves as instructions, which when executed by a processor cause the processor to perform various steps and methods according to the present teachings. For example, in accordance with various representative embodiments, the instructions in the memory 108 cause the computer to send a control signal to the current source to provide an excitation current to the surface coil, and control signal to the controller to properly position the components of the system. The excitation current from the current source 104 results in the generation of the first magnetic field passing through the electrical connections in the region of interest 120 based on the excitation current from the current source 104, which in turn results in the generation of the third magnetic field, and ultimately the second magnetic field that is measured by the magnetic field sensor 122.

The various types of ROM and RAM of the memory 108 may include any number, type and combination of computer readable storage media, such as a disk drive, flash memory, an electrically programmable read-only memory (EPROM), an electrically erasable and programmable read only memory (EEPROM), registers, a hard disk, a removable disk, tape, compact disk read only memory (CD-ROM), digital versatile disk (DVD), floppy disk, Blu-ray disk, a universal serial bus (USB) drive, or any other form of storage medium known in the art. The memory 108 is a tangible storage medium for storing data and executable software instructions, and is non-transitory during the time software instructions are stored therein. As used herein, the term "non-transitory" is to be interpreted not as an eternal characteristic of a state, but as a characteristic of a state that will last for a period. The term "non-transitory" specifically disavows fleeting characteristics such as characteristics of a carrier wave or signal or other forms that exist only transitorily in any place at any time. The memory 108 may store software instructions and/or computer readable code that enable performance of various functions. The memory 108 may be secure and/or encrypted, or unsecure and/or unencrypted.

"Memory" are examples of computer-readable storage media, and should be interpreted as possibly being multiple memories or databases. The memory 108 may, for instance, be multiple memories or databases local to the computer 110, and/or distributed amongst multiple computer systems or computing devices. Furthermore, the memory 108 comprise a computer readable storage medium that is defined to be any medium that constitutes patentable subject matter under 35 U.S.C. § 101 and excludes any medium that does not constitute patentable subject matter under 35 U.S.C. § 101.

Figure 2:
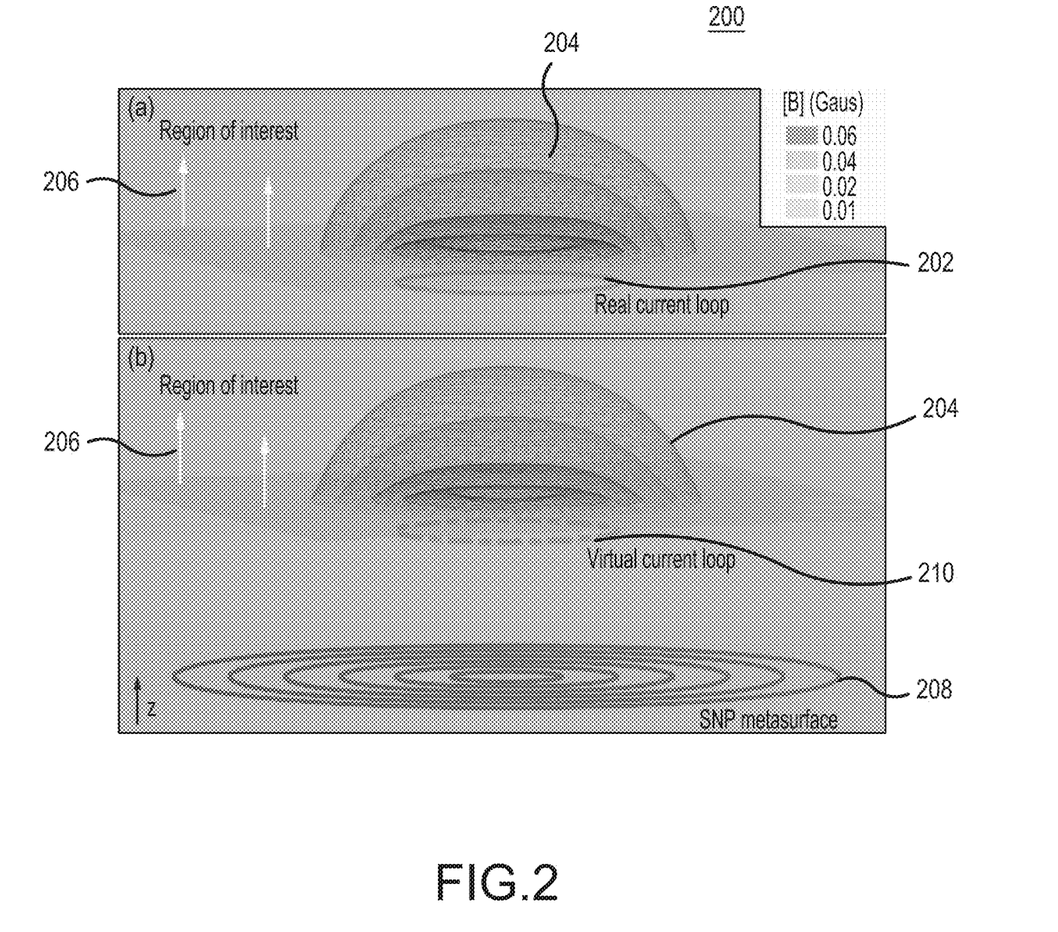
FIG. 2 is a conceptual diagram showing the field generation of a real current loop and an intermediate virtual current loop in a region of interest, according to a representative embodiment.

FIG. 2 is a conceptual diagram showing the field generation of a real current loop (a) and a virtual current loop (b) in a region of interest 206, according to a representative embodiment. Various aspects and details of the description of FIG. 2 may be common to those described above in connection with the description of FIG. 1. These common aspects and detail may not be repeated below to avoid obscuring the description of FIG. 2.

Turning to FIG. 2, a real current loop 202 is shown, which generates a magnetic field 204 in (a). Moreover, a virtual current loop 210 results from a static negative permeability (SNP) metasurface 208 is shown in (b). The virtual current loop 210 in turn generates the magnetic field 204. As described more fully below, the SNP metasurface 208, functioning as an electromagnetic lens, is a two-dimensional structure composed of a set of concentric current loops located on a surface, and it duplicates the effect of a negative magnetic permeability (μ) material that achieves a magnetic illusion that creates a magnetic field (e.g., magnetic field 204) at a distance which is equivalent to that generated by a virtual current loop 210, and behaving in the same manner as the real current loop 202 shown in (a). This magnetic field 204 is controlled by the application of excitation current to the SNP metasurface 208. Notably, while resonances from passive materials or devices can produce a negative permeability in a dynamic condition, by known devices, this would not occur in a static condition in which magnetic fields are not time-dependent, also the size of the device needs to be large enough to achieve the resonance at relative low frequency. However, by the present teachings an active source current enables the creation of a layer with a negative permeability. This enables the focusing of the magnetic field 204 in a region of interest as shown.

Figure 3A:
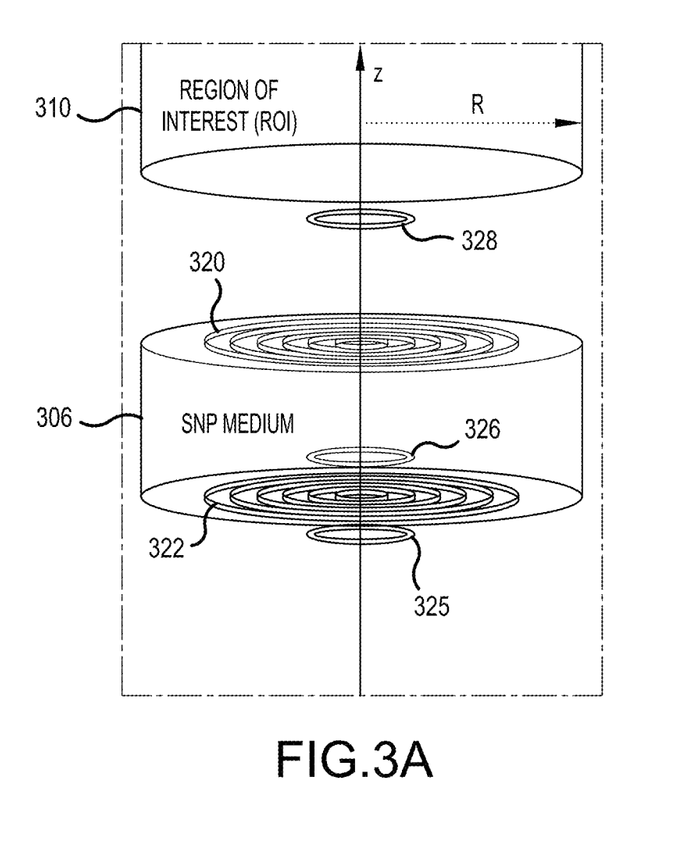
FIG. 3 is a conceptual diagram showing the generation of a static negative permeability (SNP) metasurface coil disposed in a plane according to a representative embodiment.
Figure 3B:
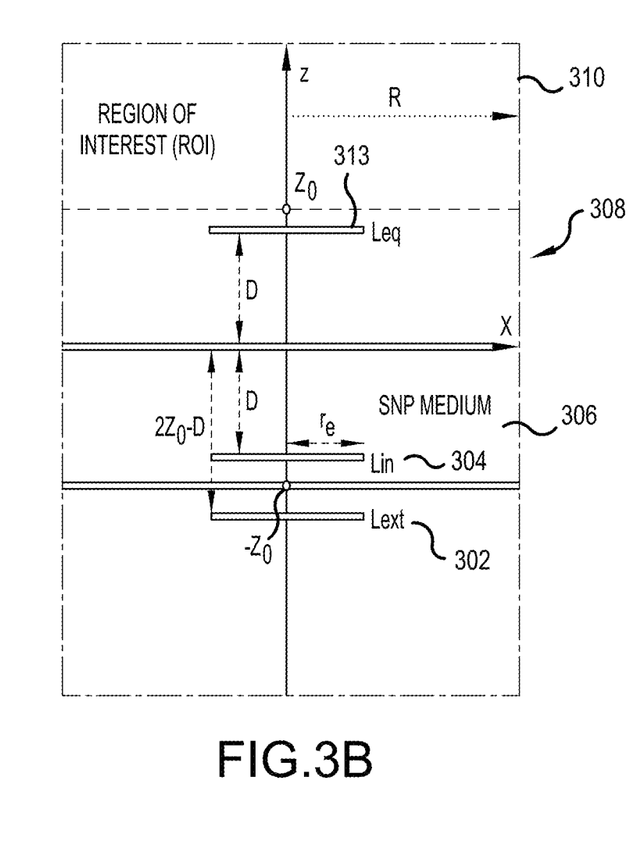

FIG. 3 is a conceptual diagram showing the generation of a static negative permeability (SNP) metasurface coil disposed in a plane according to a representative embodiment. Various aspects and details of the description of FIG. 3 may be common to those described above in connection with the description of FIGS. 1 and 2. These common aspects and detail may not be repeated below to avoid obscuring the description of FIG. 3.

Turning to FIG. 3 at (a) and (b), a cylindrical SNP medium 306 having a thickness of $Z_0$ ($z=-Z_0$ to 0), an infinite radius, R, and relative magnetic permeability $\mu_r=-1$. When a coaxial excitation loop current $I_e$ at $z=-D$ is embedded in the medium, $L_{in}$ 304, or disposed outside the medium at $z=-2Z_0+D$, $L_{ext}$ 302, the excitation loop current $I_e$ together with the cylindrical SNP medium 306 will generate fields in the region of interest ($z>Z_0$) as shown in FIG. 3. Furthermore, the field is the same as that generated by the virtual loop current at $z=D$ with the same current $I_e$, $L_{eq}$ 313.

The surface magnetization current density on the top and bottom surface of the cylindrical SNP medium 306 (which can be mimicked by the SNP metasurface current loops 320 and auxiliary current loops 322) can be derived from solving the magnetostatic Maxwell's Equations. Specifically, with vectors shown in bold, because:

$$B = (\nabla \times A) \quad (1)$$

where B is the magnetic field, and A is the magnetic vector potential. With the coulomb gauge condition:

$$(\nabla \cdot A) = 0. \quad (2)$$

$$\nabla^2 A = \nabla(\nabla \cdot A) - \nabla \times (\nabla \times A) = -\mu_m \mathbf{J} \quad (3)$$

where J is the free current density for the exciting current loop $L_{in}$ or $L_{ext}$ inside or outside the SNP medium, and $\mu_m$ is the magnetic permeability for the medium where the excitation loops $L_{in}$ or $L_{ext}$ are placed in. Since $\mathbf{J} = J_\phi(r, z)\hat{\phi}$, $A = A_\phi(r, z)\hat{\phi}$, (where r is the radial coordinate, $\phi$ is the azimuth, and z is the height for the cylindrical coordinate system) and at any position the magnetic field can be derived as:

$$B_r = -\frac{\partial A_\phi}{\partial z}, \quad B_z = \frac{1}{r}\frac{\partial (rA_\phi)}{\partial r} \quad (4)$$

To simplify the notation, the region above the SNP medium in FIG. 3 is defined as UP region, and the region below the SNP medium as the DOWN region. When the excitation is $L_{in}$, or $L_{ext}$, the laplacian of A is zero in the whole space except at the position where the excitation loop $L_{in}$ or $L_{ext}$ is, Next, at the top and bottom surfaces of the cylindrical SNP medium 306, the boundary condition must be satisfied as:

$$B_{z-in} = B_{z-out}, \quad \frac{B_{r-in}}{\mu_{in}} = \frac{B_{r-out}}{\mu_{out}} \quad (5)$$

where, $B_z$ and $B_r$ denote the normal and tangential components of the B on the boundary, the subscript in and out denote inside or outside the SNP medium. In the current situation, $\mu_{in} = -\mu_{out}$. Moreover, $\mu_m = -\mu_0$ and $\mu_0$ for $L_{in}$ and $L_{ext}$ excitation, respectively, where $\mu_0$ is the free space permeability.

Solving the equations of A with the boundary conditions on the surface of the SNP medium, when the excitation is $L_{in}$, $$A_\phi^{UP}(r, z) = \frac{\mu_0 I_e r_e}{2} \int_0^\infty e^{-(z-D)t} J_1(r_e t) J_1(rt) dt \quad (6)$$

$$A_\phi^{SNP}(r, z) = \frac{\mu_0 I_e r_e}{2} \int_0^\infty \left(-e^{-|z+D|t} + e^{(z+D)t} + e^{-(z+D)t}\right) J_1(r_e t) J_1(rt) dt$$

$$A_\phi^{DOWN}(r, z) = \frac{\mu_0 I_e r_e}{2} \int_0^\infty e^{(z+2Z_0-D)t} J_1(r_e t) J_1(rt) dt$$

When the excitation is $L_{ext}$:

$$A_\phi^{UP}(r, z) = \frac{\mu_0 I_e r_e}{2} \int_0^\infty e^{-(z-D)t} J_1(r_e t) J_1(rt) dt \quad (7)$$

$$A_\phi^{SNP}(r, z) = \frac{\mu_0 I_e r_e}{2} \int_0^\infty e^{(z+D)t} J_1(r_e t) J_1(rt) dt$$

$$A_\phi^{DOWN}(r, z) = \frac{\mu_0 I_e r_e}{2} \int_0^\infty e^{-|z+2Z_0-D|t} J_1(r_e t) J_1(rt) dt$$

Where $r_e$ is the radius of the loop $L_{in}$ 304 or $L_{ext}$ 302, and $J_1(x)$ is the cylindrical Bessel function of the first kind with order 1. Based on Eq. (4) and the expression of $A_\phi^{SNP}$ in Eq. (6), the surface magnetization current density for the L in excitation becomes:

$$K_t^{in}(r)\big|_{z=0} = M_r\big|_{z=0} \hat{r} \times \hat{z} = -\frac{2B_r}{\mu_0}\bigg|_{z=0} \hat{\phi} = \frac{2\frac{\partial A_\phi}{\partial z}}{\mu_0}\bigg|_{z=0} \hat{\phi} = \quad (8)$$

$$I_e r_e \int_0^\infty t e^{Dt} J_1(r_e t) J_1(rt) dt \hat{\phi}$$

$$K_a^{in}(r)\big|_{z=-Z_0} = M_r\big|_{z=-Z_0} \hat{r} \times -\hat{z} = \frac{2B_r}{\mu_0}\bigg|_{z=-Z_0} \hat{\phi} = -\frac{2\frac{\partial A_\phi}{\partial z}}{\mu_0}\bigg|_{z=-Z_0} \hat{\phi} =$$

$$I_e r_e \int_0^\infty t e^{(Z_0-D)t} J_1(r_e t) J_1(rt) dt \hat{\phi}$$

Where $M_r$ is the radial component of the magnetization field, and the surface magnetization current density on the top and bottom surface of cylindrical SNP medium 306 are denoted as $K_t(r)$ and $K_a(r)$ respectively, the superscript in or ext denotes the excitation loop is $L_{in}$ 304 or $L_{ext}$ 302. Similarly, based on Eq. (4) and the expression of $A_\phi^{SNP}$ in Eq. (7), the surface magnetization current density for the $L_{ext}$ excitation becomes:

$$K_t^{ext}(r)|_{z=0} = I_e r_e \int_0^\infty t e^{Dt} J_1(r_e t) J_1(rt) dt \hat{\phi} \quad (9)$$

$$K_a^{ext}(r)|_{z=-Z_0} = -I_e r_e \int_0^\infty t e^{-(Z_0-D)t} J_1(r_e t) J_1(rt) dt \hat{\phi}$$

Notably, $K_t^{in}(r)|_{z=0} K_t^{ext}(r)|_{z=0} = K_t(r)$, which means no matter where the excitation loop is placed, the SNP metasurface always results in the same current density, and both of them have a divergent form. This means that an exact implementation of the SNP metasurface current loops 320 needs an infinite surface current density. However, this can be truncated to an approximation of $K_t(r)$. Moreover, the bottom auxiliary surface current density $K_a(r)$ has a divergent or convergent form based on the excitation loop is $L_{in}$ or $L_{ext}$.

The magnetic field in the whole space thus can be transformed to the summation of the field generated from $K_t(r)$, $K_a(r)$ and the excitation current at $L_{in}$, or $L_{ext}$ in a space of $\mu_r=1$ (it should be noted that when the excitation loop is $L_{in}$, the current direction should tune to opposite compared with its original direction since it is originally placed in the negative permeability value region). Besides, in the region of interest 310, the field generated by the excitation current at $L_{in}$ or $L_{ext}$ cancels with the field generated by the $K_a(r)$. This means that only the SNP metasurface current loops 320 is needed to generate magnetic fields in the region of interest 310, which may be inaccessible due to the structure in which they are located.

It can be shown that when D approaches to 0:

$$K_t(r) = I_e r_e \int_0^\infty t J_1(r_e t) J_1(rt) dt \hat{\phi} = I_e r_e \frac{\delta(r-r_e)}{r_e} \hat{\phi} = I_e \delta(r-r_e) \hat{\phi} \quad (10)$$

This is equivalent to the excitation current loop with current $I_e$ at z=0. And the SNP metasurface does not displace the original excitation loop at all. While when D is increasing and approaching to the value of $Z_0$, the surface current density increases exponentially due to the component $e^{Dt}$ in the integration expression. This means that more power from current source 104 is needed to generate the magnetic field at a more distant (+z direction in FIG. 3) location in the region of interest 310.

To physically implement the SNP metasurface current loops 320 and the auxiliary current loops 322, $K_t(r)$, $K_a(r)$ are truncated and discretized in the r-direction into $n_m$ concentric surface currents loops. This truncation and discretization can be done by imposing the boundary condition at the boundaries of the cylindrical SNP medium 306 at $z=-Z_0$ and $z=0$ with presetting the radii of the $n_m$ concentric SNP metasurface currents loops 320 and the $n_m$ concentric auxiliary currents loops 322. This boundary condition is imposed by minimizing the residual function f:

$$f = \sum_{j=1}^{n_c} \left( \sum_{i=1}^{2n_m+1} \frac{B_{t-in}^{ij}}{\mu_{in}} - \sum_{i=1}^{2n_m+1} \frac{B_{t-out}^{ij}}{\mu_{out}} \right)^2 \quad (11)$$

Where B t denotes the tangential components of the magnetic field at the boundary, which generated from the SNP metasurface currents loops 320, auxiliary currents loops 322 and the current at the excitation loop position, and μ is the relative permeability. Notably, i is the current loops indexes, j denotes the different observation point on the boundary of the cylindrical SNP medium 306 and $n_c$ is the total number of observation points on the boundary that are used to check the boundary conditions. Furthermore, for each observation point, the magnetic field inside or outside the SNP medium can be estimated at $\delta z (\delta z << Z_0)$ away from the boundary surface.

For optimization, the magnetic field of the SNP metasurface current loops 320, auxiliary currents 322 and excitation loop $L_{in}$ or $L_{ext}$ can be calculated based on the existing closed-form expression for the field generated from circular current loop. Notably, when the excitation loop 326 (same as the 304) is located within the cylindrical SNP medium 306, the current direction inside the 326 for the optimization should change to the opposite due to the negative permeability. This is because that the excitation loop 326 is originally located within a region with the negative permeability ($\mu_r=-1$), which will generate a magnetic field equivalent to a current loop with opposite current direction at the same position in the free space. As such, the sign is flipped due to the transformation of negative permeability space to free space in the optimization.

Figure 4:
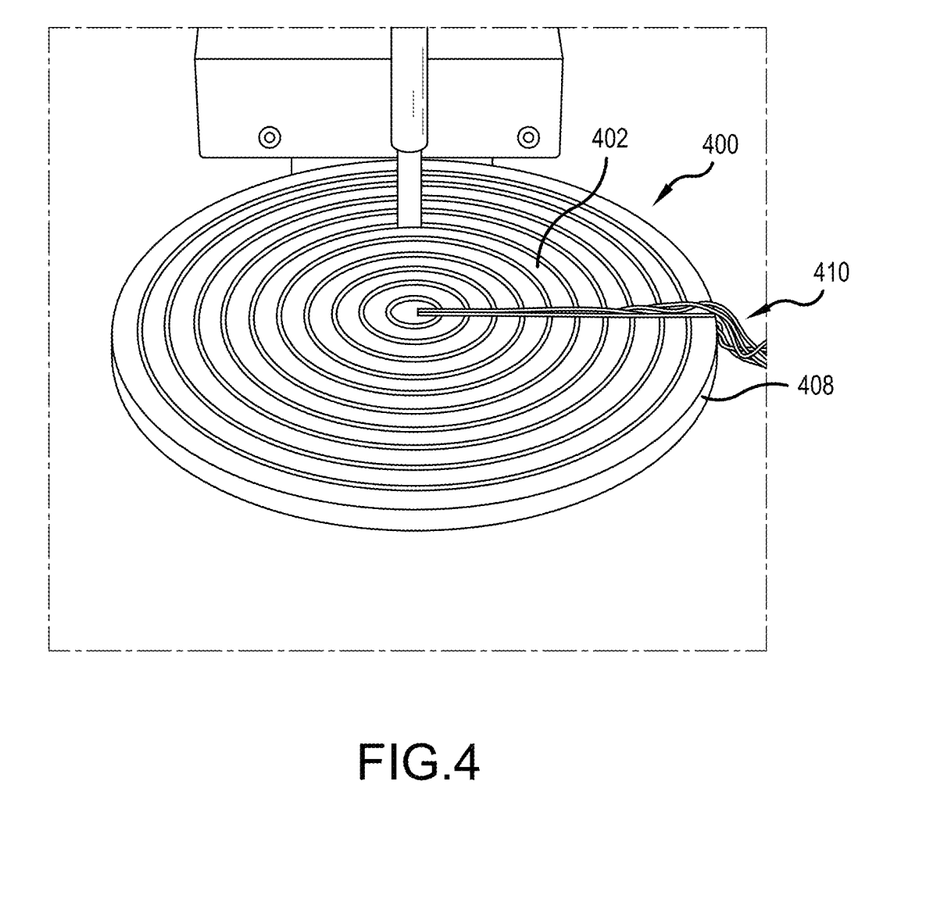
FIG. 4 is a perspective view of a surface coil comprising a plurality of concentric loops according to a representative embodiment.

FIG. 4 is a perspective view of a surface coil 400 comprising a plurality of concentric surface coil loops 402 according to a representative embodiment. Various aspects and details of the description of FIG. 4 may be common to those described above in connection with the description of FIGS. 1-3. These common aspects and detail may not be repeated below to avoid obscuring the description of FIG. 4.

The surface coil 400 in the representative embodiment comprises a first layer 408, and the concentric surface coil loops 402 on it is an example for the SNP metasurface. Moreover, the deliver traces 410 can be designed using twisted wires to avoid the distortion of the magnetic field caused by the deliver traces 410.

The application of the SNP metasurface can be extended to a quasistatic frequency range, if the wavelength is much greater than the dimension of the sensor device.

As noted above, and as described in connection with FIGS. 5 and 6 below, surface coil 400 is adapted to generate intermediate coaxial current loops in an inaccessible region of the DUT. These intermediate coaxial current loops can generate a magnetic field (sometimes referred to herein as the first magnetic field) in a region of interest, which illustratively comprises electrical connections, such as would be found in an IC or multilayer circuit board. The magnetic field generated in the region of interest 120 in turn induces current in the electrical connections in the region of interest, and these in turn create a magnetic field (sometimes referred to herein as the third magnetic field). A magnetic field sensor is located in an accessible region of the system (e.g., on the outside of the DUT) and measures a magnetic field (sometimes referred to herein as the second magnetic field) located in this accessible region. As noted above, the second magnetic field, which is measured by the magnetic field sensor, is a combination of the first and third magnetic fields.

Figures 5A, 5B:
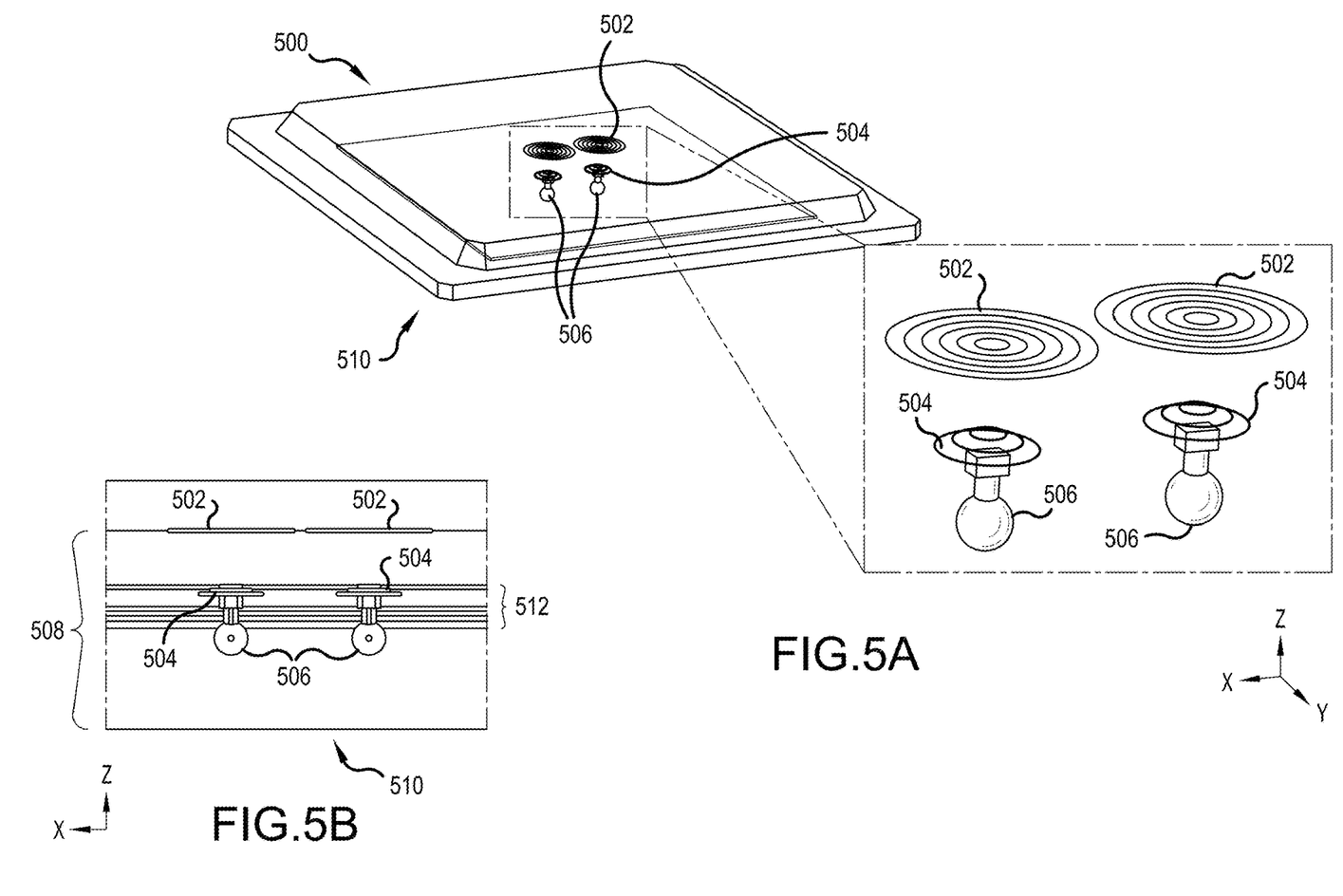
FIG. 5A is a perspective view showing surface coil loops and virtual coil loops used in testing an IC according to a representative embodiment.
FIG. 5B is a cross-sectional view of surface coil loops and virtual coil loops used in testing an IC according to a representative embodiment.

FIG. 5A is a perspective view showing SNP metasurface coil loops 502 and virtual current loops 504 used in testing an IC 500 according to a representative embodiment. Various aspects and details of the description of FIG. 5A may be common to those described above in connection with the description of FIGS. 1-4. These common aspects and detail may not be repeated below to avoid obscuring the description of FIG. 5A.

In the representative embodiment, the electrical connections under test are conductive balls 506 that are components of a ball grid array commonly used in IC packaging technology. Again, the selection of the conductive balls 506 for the electrical connections in the IC 500 is merely illustrative, and other types of connections are contemplated, as are other structures to be tested.

In operation, excitation current is provided by the current source (not shown in FIG. 5), and the SNP metasurface coil loops 502 comprising a plurality of concentric currents loops are disposed at a first region located away from the electrical connections under test (in this case conductive balls 506). The loops of the SNP metasurface coil loops 502 generates the first magnetic fields, which are equivalent to the magnetic field generated by a coaxial intermediate current loop adjacent to the electrical connections based on an excitation current in the surface coil. As noted above, the first magnetic fields are often referred to be generated by the virtual current loops 504. Furthermore, the virtual current loops 504 can be created by linear addition of the excitation current needed to create each of them in the SNP metasurface coil loops 502, the first magnetic fields in turn induce currents in the electrical connections in an inaccessible region 508. The currents induced in the conductive balls 506 in turn create another magnetic field (the third magnetic field according to the present disclosure). The first and third magnetic fields are combined to form the second magnetic field in an accessible region 510 of the system (e.g., on the outside of the DUT). A magnetic sensor adapted to detect a second magnetic field at a second region located away from the electrical connections, wherein variations in the detected second magnetic field provide categories of performance of the electrical connections.

FIG. 5B is a cross-sectional view of the SNP metasurface coil loops 502 and the virtual current loops 504 used in testing the IC 500 shown in FIG. 5A. Various aspects and details of the description of FIG. 5B may be common to those described above in connection with the description of FIGS. 1-5A. These common aspects and detail may not be repeated below to avoid obscuring the description of FIG. 5B.

Again, an excitation current is provided by the current source (not shown in FIG. 5B), and the SNP metasurface coil loops 502 comprising a plurality of concentric current loops are disposed at a first region above 508, which is located away from the electrical connections under test (in this case conductive balls 506). The currents of the SNP metasurface coil loops 502 generates the first magnetic fields, which are equivalent to that generated from a coaxial intermediate current loop adjacent to the electrical connections based on an excitation current in the surface coil. As noted above, the first magnetic fields are often referred to be generated by the virtual current loops 504. And the virtual current loops 504 can be created by linearly adding the excitation current needed to create each of them in the SNP metasurface coil loops 502, the first magnetic fields in turn induce currents in the electrical connections in an inaccessible region 508. The currents induced in the conductive balls 506 in turn create another magnetic field (the third magnetic field according to the present disclosure). As shown in FIG. 5B, the inaccessible region 508 in this illustrative example may comprise a plurality of layers 512 with other conductive material in multilayer boards and ICs generally. Moreover, the effects of them are not considered in this example.

The first and third magnetic fields generated by the SNP metasurface coil loops 502 and the electrical connections are combined to form the second magnetic field in an accessible region 510 of the system (e.g., on the outside of the DUT). A magnetic sensor adapted to detect a second magnetic field at a second region located away from the electrical connections, wherein variations in the detected second magnetic field provide categories of performance of the electrical connections.

Figure 6:
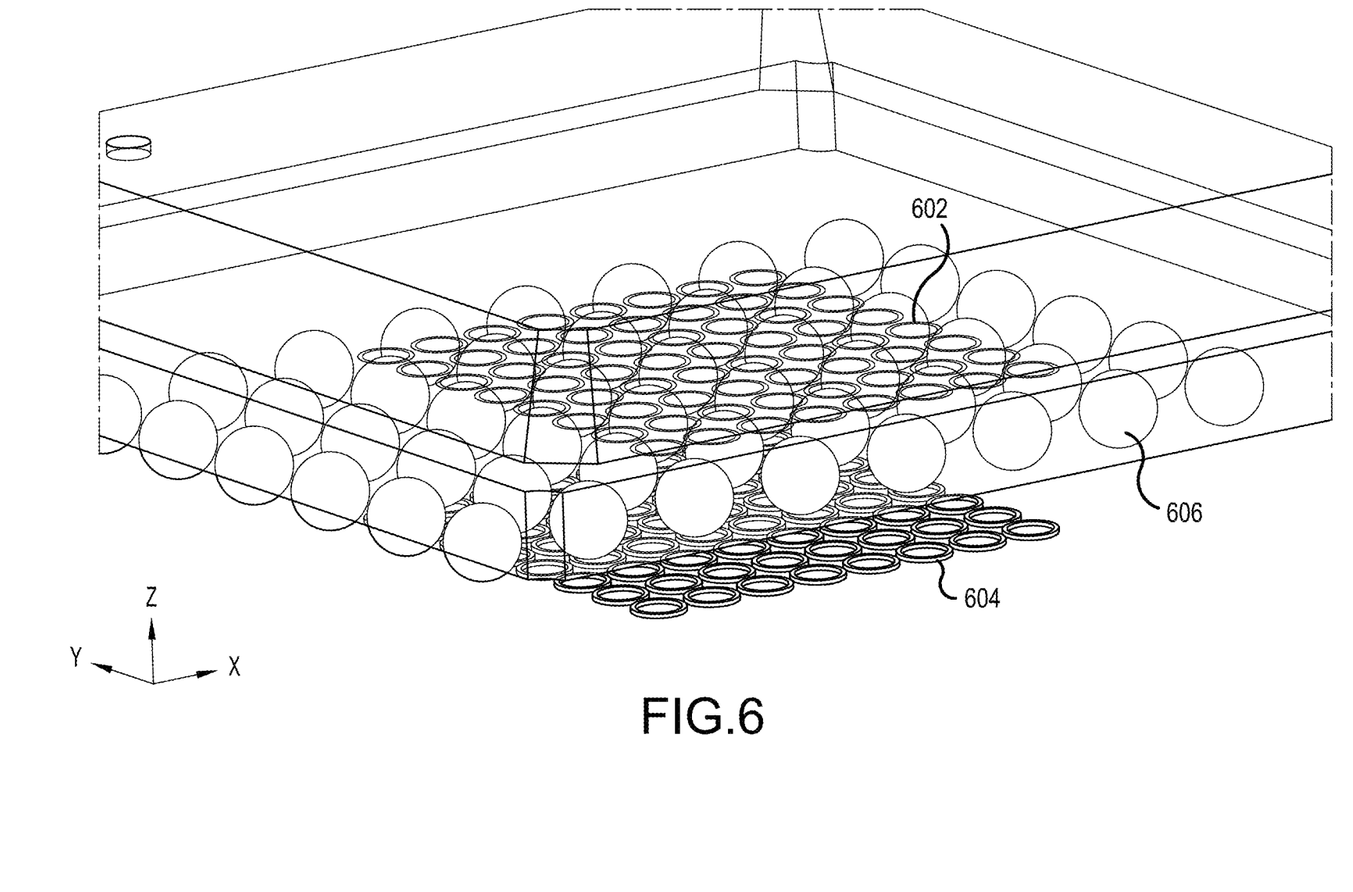
FIG. 6 is a perspective view showing the possible locations of the virtual coil loops and sensing loops used in testing an IC according to a representative embodiment.

FIG. 6 is a perspective view showing a plurality of virtual loops and sensing loops used in testing an IC according to a representative embodiment. Possible locations 602 are locations where the virtual current loops could be in the inaccessible region for testing. Possible locations 604 are locations where the pickup coil sensor (e.g., magnetic field sensors 122) can be for sensing the variation of the second magnetic field. Besides, 606 are the BGA electrical connections under test for example.

Although devices and systems for testing a DUT in an inaccessible region are described with reference to several exemplary embodiments, it is understood that the words that have been used are words of description and illustration, rather than words of limitation. Changes may be made within the purview of the appended claims, as presently stated and as amended, without departing from the scope and spirit of pose estimation of a subject in its aspects. Although developing adaptable predictive analytics has been described with reference to particular means, materials and embodiments, developing adaptable predictive analytics is not intended to be limited to the particulars disclosed; rather developing adaptable predictive analytics extends to all functionally equivalent structures, methods, and uses such as are within the scope of the appended claims.

The illustrations of the embodiments described herein are intended to provide a general understanding of the structure of the various embodiments. The illustrations are not intended to serve as a complete description of all of the elements and features of the disclosure described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be minimized. Accordingly, the disclosure and the figures are to be regarded as illustrative rather than restrictive.

The Abstract of the Disclosure is provided to comply with 37 C.F.R. § 1.72(b) and is submitted with the understanding that it will not be used to interpret or limit the scope or meaning of the claims. In addition, in the foregoing Detailed Description, various features may be grouped together or described in a single embodiment for the purpose of streamlining the disclosure. This disclosure is not to be interpreted as reflecting an intention that the claimed embodiments require more features than are expressly recited in each claim. Rather, as the following claims reflect, inventive subject matter may be directed to less than all of the features of any of the disclosed embodiments. Thus, the following claims are incorporated into the Detailed Description, with each claim standing on its own as defining separately claimed subject matter.

The preceding description of the disclosed embodiments is provided to enable any person skilled in the art to practice the concepts described in the present disclosure. As such, the above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents and shall not be restricted or limited by the foregoing detailed description.

The invention claimed is:

1. A sensor device for testing electrical connections using contactless fault detection, the sensor device comprising:
   a surface coil comprising a plurality of concentric loops disposed at a first region located away from the electrical connections, wherein the concentric loops generate a first magnetic field passing through the electrical connections, and the first magnetic field is equivalent to that generated by a coaxial intermediate current loop adjacent to the electrical connections based on an excitation current in the surface coil; and
   a magnetic sensor adapted to detect a second magnetic field at a second region located away from the electrical connections.

2. The sensor device of claim 1, wherein the second magnetic field at the sensor comprises a combination of the first magnetic field and a third magnetic field.

3. The sensor device of claim 2, wherein a coaxial intermediate current loop generates the first magnetic field passing through the third region, and a current in the electrical connections generates the third magnetic field.

4. The sensor device of claim 2, wherein the variations in the second magnetic field result from an open circuit defect or a short circuit defect in the electrical connections.

5. The sensor device of claim 4, wherein the short circuit defect blocks the first magnetic field from the coaxial intermediate current loop and results in the second magnetic field having a lower magnetic field measured by the sensor compared with an electrical connection without a short circuit defect.

6. The sensor device of claim 4, wherein the open circuit defect causes magnetic field leakage through the open circuit defect to the sensor and results in the second magnetic field having a greater magnitude measured by the sensor compared with an electrical connection without an open circuit.

7. The sensor device of claim 1, wherein the surface coil is a static negative permeability (SNP) metasurface coil disposed in a plane.

8. The sensor device of claim 1, wherein electrical connections are components of a device under test (DUT), and the electrical connections are in third region.

9. The sensor device of claim 8, wherein the DUT comprises a circuit package comprising electronic components and electrical connections.

10. The sensor device of claim 1, wherein the electrical connections comprise a plurality of electrically conductive balls configured to provide electrical connections between a circuit package and a printed circuit board.

11. The sensor device of claim 1, wherein a level of current in the excitation current are determined based on a desired location of the coaxial intermediate current loop.

12. A system for testing electrical connections in device under test (DUT) using contactless fault detection, the system comprising:
    a surface coil comprising a plurality of concentric loops disposed at a first region located away from the electrical connections, wherein the concentric loops generate a first magnetic field passing through the electrical connections, and the first magnetic field is equivalent to that generated by a coaxial intermediate current loop adjacent to the electrical connections based on an excitation current in the surface coil;
    a sensor adapted to detect a second magnetic field at a second region located away from the electrical connections; and
    a controller adapted to adjust a location and a current value of the surface coil to provide the coaxial intermediate current loop at a desired location.

13. The system of claim 12, wherein the second magnetic field at the sensor comprises a combination of the first magnetic field and a third magnetic field.

14. The system of claim 13, wherein a coaxial intermediate current loop generates the first magnetic field passing through the third region, and a current in the electrical connections generates the third magnetic field.

15. The system of claim 13, wherein the variations in the second magnetic field result from an open circuit defect or a short circuit defect in the electrical connections.

16. The system of claim 15, wherein the short circuit defect blocks the first magnetic field from the coaxial intermediate current loop and results in the second magnetic field having a lower magnetic field measured by the sensor compared with an electrical connection without a short circuit defect.

17. The system of claim 15, wherein the open circuit defect causes magnetic field leakage through the open circuit defect to the sensor and results in the second magnetic field having a greater magnitude measured by the sensor compared with an electrical connection without an open circuit.

18. The system of claim 12, wherein the surface coil is a static negative permeability (SNP) metasurface coil disposed in a plane.

19. The system of claim 12, wherein electrical connections are components of a device under test (DUT), and the electrical connections are in the third region.

20. The system of claim 12, wherein the electrical connections comprise a plurality of electrically conductive balls configured to provide electrical connections between a circuit package and a printed circuit board.

* * * * *